United States Patent
Luo

(10) Patent No.: US 11,991,895 B2
(45) Date of Patent: May 21, 2024

(54) DISPLAY PANEL AND MANUFACTURING METHOD THEREFOR, AND DISPLAY DEVICE

(71) Applicant: BOE TECHNOLOGY GROUP CO., LTD., Beijing (CN)

(72) Inventor: Chengyuan Luo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 571 days.

(21) Appl. No.: 17/286,835

(22) PCT Filed: Jul. 8, 2020

(86) PCT No.: PCT/CN2020/100745
§ 371 (c)(1),
(2) Date: Apr. 20, 2021

(87) PCT Pub. No.: WO2021/008411
PCT Pub. Date: Jan. 21, 2021

(65) Prior Publication Data
US 2021/0343970 A1  Nov. 4, 2021

(30) Foreign Application Priority Data

Jul. 15, 2019 (CN) .......................... 201910635296.7

(51) Int. Cl.
*H01L 51/52* (2006.01)
*H01L 51/56* (2006.01)
(Continued)

(52) U.S. Cl.
CPC ..... *H10K 50/8428* (2023.02); *H10K 50/8426* (2023.02); *H10K 71/00* (2023.02); *H10K 2102/311* (2023.02)

(58) Field of Classification Search
CPC .... H10K 50/84; H10K 50/841; H10K 50/842; H10K 50/8426; H10K 50/8428;
(Continued)

(56) References Cited

U.S. PATENT DOCUMENTS 11,374,195 B2 *  6/2022  Yu .......................... H10K 59/00
2016/0329519 A1 * 11/2016  Yu ........................ H10K 50/846
(Continued)

FOREIGN PATENT DOCUMENTS

CN    105549272    5/2016
CN    207650513    7/2018
(Continued)

OTHER PUBLICATIONS

Chinese First Office Action (w/ English translation) for corresponding CN Application No. 201910635296.7, 15 pages.
(Continued)

*Primary Examiner* — Victoria K. Hall
(74) *Attorney, Agent, or Firm* — Dority & Manning, P.A.

(57) ABSTRACT

A display panel includes: a display substrate having a display area and a peripheral area around the display area; a cover plate assembled with the display substrate; a reinforcement layer disposed in the peripheral area, the reinforcement layer including a plurality of first corner guards, and the first corner guards being distributed around the display area at intervals; a dam disposed in the peripheral area, the dam being of a closed loop structure around the display area, the dam having a plurality of corners, and inner walls of the corners being matched with and in contact with outer walls of the first corner guards in one-to-one correspondence; and a filling layer filled in a space enclosed by the display substrate, the cover plate, the first corner guards and the dam, the filling layer being in contact with inner walls of the first corner guards.

18 Claims, 3 Drawing Sheets

(51) Int. Cl.
  *H10K 50/842*   (2023.01)
  *H10K 71/00*    (2023.01)
  *H10K 102/00*   (2023.01)

(58) Field of Classification Search
  CPC .... H10K 59/87; H10K 59/871; H10K 59/872;
                    H10K 59/8722; H10K 59/8723
  See application file for complete search history.

(56) References Cited

U.S. PATENT DOCUMENTS

| | | | |
|---|---|---|---|
| 2019/0189957 A1* | 6/2019 | Gil | H10K 59/122 |
| 2019/0207153 A1* | 7/2019 | Hou | H10K 50/846 |
| 2020/0251682 A1* | 8/2020 | Guo | H10K 59/12 |
| 2021/0157184 A1* | 5/2021 | Zhu | G02F 1/13394 |

FOREIGN PATENT DOCUMENTS

| | | |
|---|---|---|
| CN | 109585682 | 4/2019 |
| CN | 110350013 | 10/2019 |
| JP | 5081572 | 11/2012 |

OTHER PUBLICATIONS

Chinese Notification to Grant Patent Right for Invention (w/ English translation) for corresponding CN Application No. 201910635296.7, 7 pages.
PCT International Search Report (w/ English translation) for corresponding PCT Application No. PCT/CN2020/100745, mailed on Oct. 10, 2020, 5 pages.

* cited by examiner

DISPLAY PANEL AND MANUFACTURING METHOD THEREFOR, AND DISPLAY DEVICE

CROSS-REFERENCE TO RELATED APPLICATIONS

This application is a national phase entry under 35 USC 371 of International Patent Application No. PCT/CN 20201100745, filed on Jul. 8, 2020, which claims priority to Chinese Patent Application No. 201910635296.7, filed on Jul. 15, 2019, which are incorporated herein by reference in their entirety.

TECHNICAL FIELD

Embodiments of the present disclosure relate to a display device, a display panel and a manufacturing method therefor.

BACKGROUND

For a display panel, the encapsulation is an indispensable process, and the purpose is to prevent moisture and oxygen from eroding the display panel to ensure the display effect. In particular, for an organic light-emitting diode (OLEO) display panel, light-emitting devices thereof are corroded easily by moisture and oxygen, which affects the display effect.

SUMMARY

In one aspect, a display panel is provided. The display panel includes a display substrate, a cover plate, a reinforcing layer, a dam, and a filling layer. The display substrate has a display area and a peripheral area around the display area. The cover plate is assembled with the display substrate. The reinforcing layer is disposed in the peripheral area and located between the display substrate and the cover plate. The reinforcing layer includes a plurality of first corner guards, and the first corner guards are distributed around the display area at intervals. The dam is disposed in the peripheral area and located between the display substrate and the cover plate. The dam is of a closed loop structure around the display area, and the dam has a plurality of corners. Inner walls of the corners are matched with and in contact with outer walls of the first corner guards in one-to-one correspondence. The filling layer is filled in a space enclosed by the display substrate, the cover plate, the first corner guards and the dam. The filling layer is in contact with inner walls of the first corner guards.

In some embodiments, a corner in the corners is in an arc shape. A first corner guard in contact with the corner includes a first curved portion, and radians of the first curved portion are the same as radians of the corner.

In some embodiments, the first corner guard further includes at least one first protrusion disposed on an inner wall of the first curved portion.

In some embodiments, a height of a first protrusion in the at least one first protrusion is not less than one third of a width of the first curved portion, and is not greater than a half of the width of the first curved portion. The width of the first curved portion is a minimum distance between the inner wall and an outer wall of the first curved portion.

In some embodiments, the at least one first protrusion includes two first protrusions, and the two first protrusions are disposed on two ends of the first curved portion, respectively.

In some embodiments, the two first protrusions are of a same shape and of a same size.

In some embodiments, the two first protrusions are axisymmetric.

In some embodiments, the reinforcing layer further includes a plurality of second corner guards. The second corner guards are distributed around the dam at intervals, and are arranged on outer sides of the corners in one-to-one correspondence.

In some embodiments, a corner in the corners is in an arc shape. A second corner guard in contact with the corner includes a second curved portion, and radians of the second curved portion are not less than radians of the corner.

In some embodiments, the second corner guard further includes at least one second protrusion disposed on an outer wall of the second curved portion.

In some embodiments, a height of a second protrusion in the at least one second protrusion is not less than one third of a width of the second curved portion, and is not greater than a half of the width of the second curved portion. The width of the second curved portion is a minimum distance between an inner wall and the outer wall of the second curved portion.

In some embodiments, the at least one second protrusion includes two second protrusions, and the two second protrusions are disposed on two ends of the second curved portion, respectively.

In some embodiments, the two second protrusions are of a same shape and of a same size.

In some embodiments, the two second protrusions are axisymmetric.

In some embodiments; each second corner guard and a corresponding corner have a gap therebetween.

In some embodiments, the reinforcing layer is made of a photoresist.

In another aspect, a manufacturing method of a display panel is provided. The manufacturing method includes: providing a display substrate and a cover plate, the display substrate having a display area and a peripheral area around the display area; forming a reinforcing layer in the peripheral area, the reinforcing layer including a plurality of first corner guards distributed around the display area at intervals; forming a dam material layer in a closed loop shape in the peripheral area, the first corner guards being located in a region enclosed by the dam material layer, the dam material layer having a plurality of corners, and inner walls of the corners being matched with and in contact with outer walls of the first corner guards in one-to-one correspondence; injecting an encapsulating material into a space enclosed by the display substrate, the first corner guards and the dam material layer; pressing the cover plate and assembling the cover plate with the display substrate, so that the encapsulating material is in contact with an inner wall of the dam material layer and inner walls of the first corner guards; curing the dam material layer to obtain a dam; and curing the encapsulating material to obtain a filling layer.

In some embodiments, forming the reinforcing layer further includes: forming a plurality of second corner guards, the second corner guards being distributed around the dam material layer at intervals; and being arranged on outer sides of the corners in one-to-one correspondence.

In some embodiments, forming the reinforcing layer in the peripheral area, includes: forming the first corner guards and the second corner guards through a single patterning process.

In yet another aspect; a display device is provided. The display device includes the display panel in any one of the above.

BRIEF DESCRIPTION OF THE DRAWINGS

In order to describe technical solutions in the present disclosure more clearly, the accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but not limitations on an actual size of a product, an actual process of a method and an actual timing of a signal to which the embodiments of the present disclosure relate.

DETAILED DESCRIPTION

Figure 1:
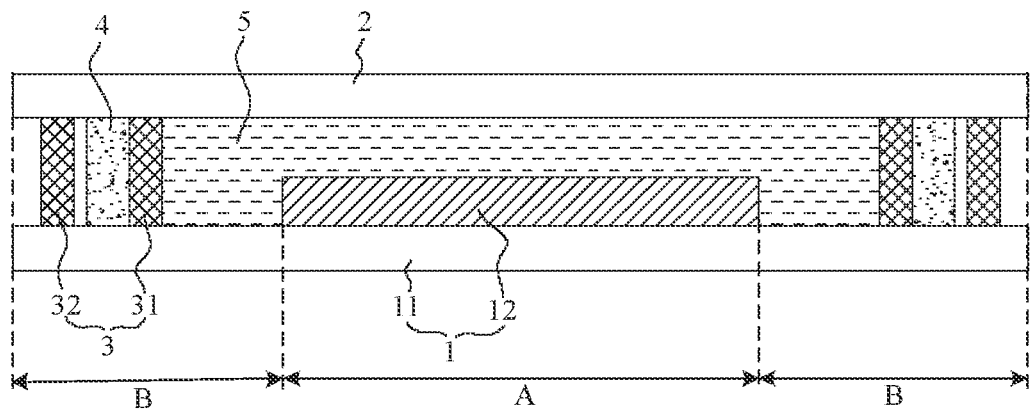
FIG. 1 is a structural diagram of a display panel, in accordance with some embodiments.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art on a basis of the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments/examples in any suitable manner.

Exemplary embodiments now are described more fully with reference to the accompanying drawings. However, the exemplary embodiments may be implemented in various forms, and should not be construed as being limited to the embodiments described herein. On the contrary, these embodiments are provided so that the present disclosure will be thorough and complete, and will fully convey the concept of the exemplary embodiments to those skilled in the art. Same reference numbers in the drawings represent same or similar structures, and thus their detail description will be omitted. In addition, the companying drawings are only schematic illustrations, and are not necessarily drawn to scale.

Although relative terms such as "upper" and "lower" are used in the description to describe a relative relationship between one marked component and another marked component, these terms are used in the description only for convenience, for example, with reference to a direction of an example in the drawings. It will be understood that, if a marked device is turned over so that it is turned upside down, a component described as "upper" will become a "lower" component. When a certain structure is "on" the other structure, it may mean that the certain structure is integrally formed on the other structure, or the certain structure is "directly" disposed on the other structure, or the certain structure is "indirectly" disposed on the other structure through another structure.

The terms such as "a," "an," "the," "said" and "at least one" are used to indicate the presence of one or more elements/components. The terms such as "comprising" and "having" are used to indicate an open inclusive meaning and refer to that there may be additional elements/components other than the listed elements/components. The terms such as "first" and "second" are used merely as labels, and are not limitations on a number of objects.

At present, there are many methods for encapsulating a display panel, and a common one is dam & fill encapsulation. However, bubbles are often generated at corner positions after the encapsulation is completed, which affects the encapsulation effect. In addition, in processes of transportation and use, cracking is easy to generate at the corner positions, which results in a failure of the encapsulation. It will be noted herein that, the above information disclosed is merely for enhancing the understanding of the background of the present disclosure, and therefore, it may contain information that does not constitute the prior art that is already known to a person of ordinary skill in the art.

Figure 2:
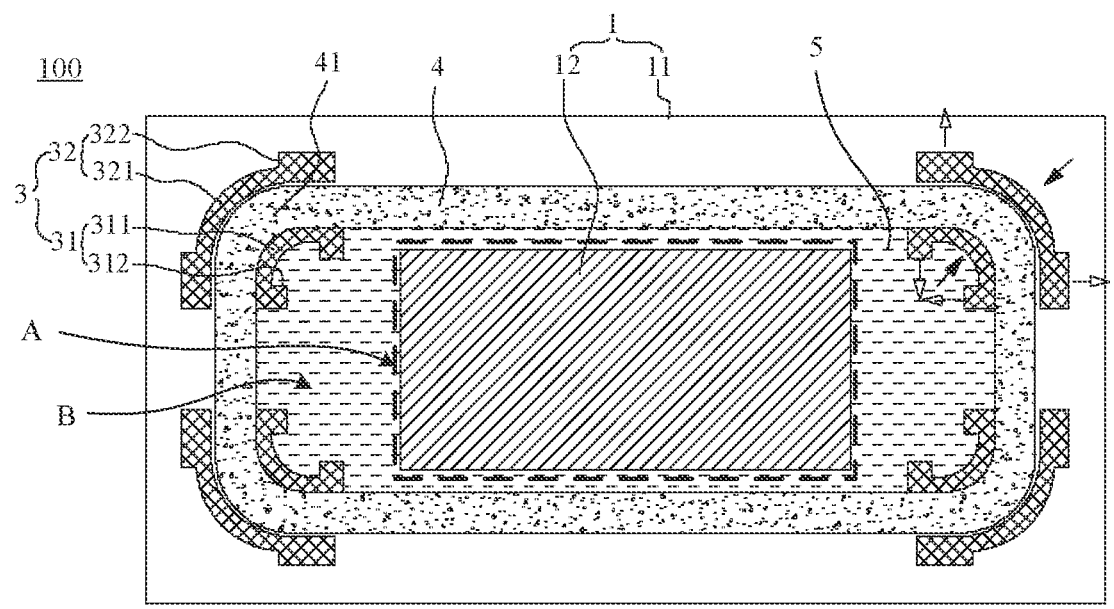
FIG. 2 is a top view of a display panel in which no cover plate is provided, in accordance with some embodiments.

Based on this, some embodiments of the present disclosure provide a display panel 100. As shown in FIGS. 1 and 2, the display panel 100 includes a display substrate 1, a cover plate 2, a reinforcing layer 3, a dam 4, and a filling layer 5. The display substrate 1 has a display area A and a peripheral area B around the display area A. The cover plate 2 is assembled with the display substrate 1.

The reinforcing layer 3 is disposed in the peripheral area B, and is located between the display substrate 1 and the cover plate 2. The reinforcing layer 3 includes a plurality of first corner guards 31, and the first corner guards 31 are distributed around the display area A at intervals.

The dam 4 is disposed in the peripheral area B, and is located between the display substrate 1 and the cover plate 2, The dam 4 is of a closed loop structure, and has a plurality of corners 41. The first corner guards 31 are located in a region enclosed by the dam 4, and inner walls of the corners 41 are matched with and in contact with outer walls of the first corner guards 31 in one-to-one correspondence.

The filling layer 5 is filled in a space enclosed by the display substrate 1, the cover plate 2, the first corner guards 31 and the dam 4. The filling layer 5 is in contact with inner walls of the first corner guards 31.

In this way, the dam 4 may be supported by the first corner guards 31 of the reinforcing layer 3 from inner sides, which improves strengths at corner positions of an encapsulation region, and thus avoids cracking. For example, for a flexible display panel, corners may be prevented from cracking when the flexible display panel is deformed, thereby improving a reliability of a product. Moreover, the first corner guards 31 may fill spaces at inner sides of the corners 41 of the dam 4, and the filling layer 5 is in contact with the inner walls of the first corner guards 31, which may prevent the generation of bubbles due to the inability of the filling layer 5 to fill spaces at the corners 41 of the dam 4, and ensure the encapsulation effect. In addition, in practical applications, the filling layer 5 may further be matched with and in contact with the inner walls of the first corner guards 31, so that the spaces at the corners 41 of the dam 4 may be filled better, which is beneficial to further preventing the generation of the bubbles and improving the encapsulation effect.

Various parts of the display panel in some embodiments of the present disclosure will be described in detail below.

As shown in FIGS. 1 to 4, the display substrate 1 has the display area A and the peripheral area B, and the peripheral area B is a loop-shaped area around the display area A. The display substrate 1 includes a base 11 and a light-emitting device layer 12 on the base 11.

A material of the base 11 may be glass, quartz, plastic, metal, etc., and the material thereof may be a hard or flexible material, which is not specifically limited herein.

The light-emitting device layer 12 is located in the display area A, and includes a plurality of light-emitting devices arranged in an array. The light-emitting devices may be used for displaying an image. For example, the light-emitting devices may be OLEO light-emitting devices, and the display substrate 1 may be an OLED display substrate.

As shown in FIG. 1, the cover plate 2 is assembled with the display substrate 1. An orthographic projection of the cover plate 2 on the display substrate 1 covers the display area A and the peripheral area B. Moreover, a material of the cover plate 2 may be a transparent material such as glass, quartz, or plastic, which will not be enumerated one by one herein.

As shown in FIGS. 1 to 4, the reinforcing layer 3 is disposed in the peripheral area B, and is located between the display substrate 1 and the cover plate 2. The reinforcing layer 3 may be arranged around the display area A, and includes the plurality of first corner guards 31, As shown in FIG. 2, the number of the first corner guards 31 may be the same as the number of the corners 41 of the dam 4.

The first corner guard 31 may be in a curved shape, and the corner 41 may be in an arc shape. For example, referring to FIGS. 2 and 4, the first corner guard 31 includes a first curved portion 311, and radians of the first curved portion 311 is the same as radians of the corner 41. The first corner guards 31 are distributed around the display area A at intervals, and are located in the region enclosed by the dam 4. The outer walls of the first corner guards 31 may be matched with and in contact with the inner walls of the corners 41 in one-to-one correspondence, so that the spaces at the inner sides of the corners 41 are filled to some extent, and the corners 41 are supported, so as to prevent deformation.

Figure 4:
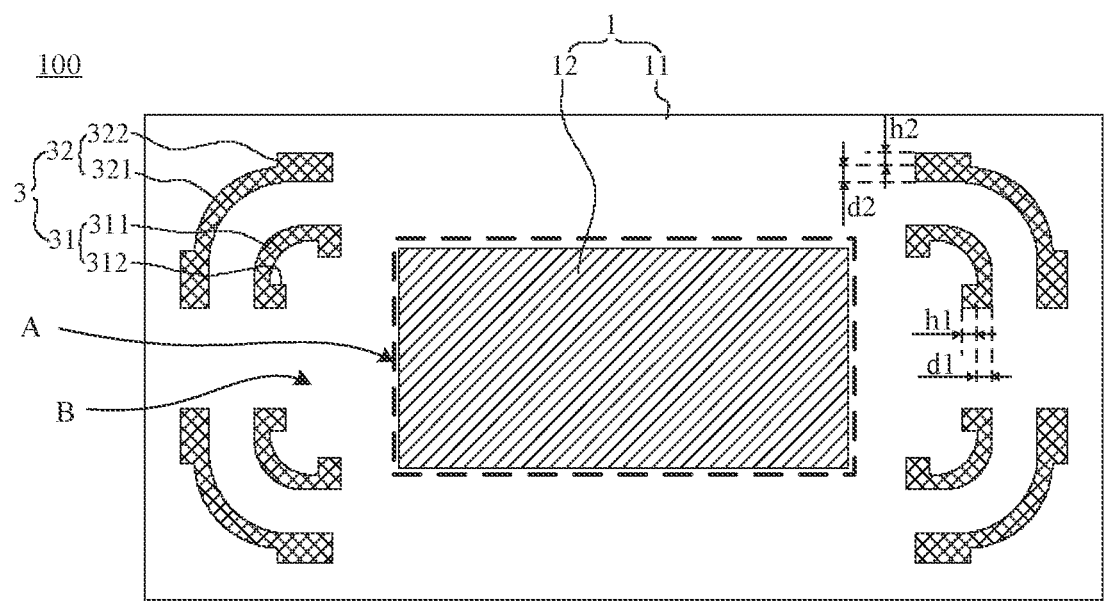
FIG. 4 is a top view of FIG. 3.

In some examples, as shown in FIGS. 2 and 4, the first corner guard 31 includes the first curved portion 311 and first protrusion(s) 312.

Both the first curved portion 311 and the corner 41 are in arc shapes, and have the same radians, so as to enable an outer wall of the first curved portion 311 to be matched with and in contact with the inner wall of the corner 41.

The first protrusion(s) 312 are disposed on an inner wall of the first curved portion 311, and protrude in a direction facing away from the first curved portion 311. The first protrusion 312(s) may be located on at least one end of the first curved portion 311. That is, at least one end of the first curved portion 311 is provided with a first protrusion 312, In this way, a stress on the first corner guard 31 may be released through the first protrusion(s) 312, thereby preventing the corner 41 from being over-stressed.

For example, as shown in FIGS. 2 and 4, the number of the first protrusion(s) 312 may be two. The two first protrusions 312 are disposed on two ends of the first curved portion 311, respectively, and protrude from the inner wall of the first curved portion 311 in two directions that are perpendicular to each other, respectively.

Based on this, for example, the two first protrusions 312 are of a same shape and of a same size. In this way, the two ends of the first curved portion 311 may be more uniformly stressed.

In addition, the two first protrusions 312 may further be axisymmetric, so as to maintain a stress balance.

For example, as shown in FIG. 4, a height h1 of the first protrusion 312 is not less than one third of a width d1 of the first curved portion 311, and is not greater than a half of the width d1 of the first curved portion 311. As shown in FIG. 4, the height h1 of the first protrusion 312 is a length of the first protrusion 312 in a direction facing away from the inner wall of the first curved portion 311. The width d1 of the first curved portion 311 is a minimum distance between the inner wall and the outer wall of the first curved portion 311.

In some embodiments, as shown in FIGS. 1 and 2, the dam 4 is disposed in the peripheral area B, and is located between the display substrate 1 and the cover plate 2. The dam 4 is of the closed loop structure, and has the plurality of arc-shaped corners 41. A portion of the dam 4 between two adjacent corners 41 is of a linear structure.

The radians of any corner 41 is the same as the radians of the first corner guard 31, and the first corner guards 31 are located within the dam 4. The inner walls of the corners 41 are matched with and in contact with the outer walls of the first corner guards 31 in one-to-one correspondence, so that spaces at the corners 41 are filled and the corners 41 are supported by the first corner guards 31, which prevents the dam 4 from cracking due to an excessive stress.

A material of the dam 4 may be a photoresist such as an ultraviolet curing resin adhesive, and may also be a thermosetting adhesive such as a thermosetting resin adhesive. For example, the material of the dam 4 may include one or more of homopolymer or copolymer of monomers (such as epoxy resin, glycidyl acrylate, glycidyl methacrylate, methyl methacrylate, ethyl methacrylate, n-butyl methacrylate, methyl polyacrylate 6, 7-epoxy heptyl ester, and 2-hydroxyethyl methacrylate), melamine formaldehyde resin, unsaturated polyester resin, silicone resin, and furan resin. Of course, the material may also include other materials. A viscosity of the dam 4 before curing may be 100,000 mPa·s to 400,000 mPa·s.

A width of the dam 4, i.e., a minimum distance between an inner wall and an outer wall of the dam 4, may be 1 mm to 3 mm. A thickness of the dam 4 may be 10 μm to 100 μm.

As shown in FIGS. 1 and 2, the filling layer 5 may be filled in the space enclosed by the display substrate 1, the cover plate 2, the first corner guards 31 and the dam 4. The filling layer 5 is matched with and in contact with the inner walls of the first corner guards 31. Since the first corner guards 31 fill spaces at the corners 41 of the dam 4 to some extent, the bubbles due to the inability of the filling layer 5 to completely fill the spaces at the corners 41 may be prevented, and the encapsulation effect is ensured.

A material of the filling layer 5 may be a resin adhesive, and a specific material may be referred to the material of the dam 4, which will not be described in detail herein. In addition, a viscosity of the filling layer 5 before curing may be 100 mPa·s to 2,000 mPa·s. A thickness of the filling layer 5 may be the same as the thickness of the dam 4.

In order to further prevent the cracking at the corner positions of the encapsulation region, and to improve a strength of the dam 4, as shown in FIGS. 1 to 4, the reinforcing layer 3 may further include a plurality of second corner guards 32. The second corner guard 32 is in a curved shape, and are distributed around the dam 4 at intervals. The second corner guards 32 are arranged on outer sides of the corners 41 in one-to-one correspondence. That is, the second corner guard 32 protrudes towards a direction facing away from a corresponding corner 41, so that deformations of the corners 41 may be restricted by the second corner guards 32 form an outer side of the dam 4, which further prevents the cracking at the corner positions of the encapsulation region.

Radians of the second corner guard 32 may be equal to or greater than the radians of the corner 41. For example, the radians of the second corner guard 32 are greater than the radians of the corner 41, and an inner wall of the second corner guard 32 and an outer wall of a corresponding corner 41 have a gap therebetween (e.g., the gap may be 20 μm to 50 μm). In this way, after the dam 4 is deformed to some extent, the second corner guard 32 is in contact with the dam 4, and supports the dam 4, so as to adapt to a deformation requirement of a flexible display panel. Of course, the inner wall of the second corner guard 32 may also be in contact with the outer wall of the corresponding corner 41.

In some embodiments, as shown in FIG. 4, the second corner guard 32 includes a second curved portion 321 and second protrusion(s) 322.

The second curved portion 321 is of a curved structure, and the corner 41 is in the arc shape. Radians of the second curved portion 321 are not less than the radians of the corner 41, so as to be arranged on the outer side of the corner 41. For example, in a case where a central angle corresponding to the corner is 90 degrees, a central angle corresponding to the second curved portion 321 may be set to be greater than 90 degrees.

The second protrusion(s) 322 are disposed on an outer wall of the second curved portion 321, and protrude in a direction facing away from the second curved portion 321. The second protrusion(s) 322 are located on at least one end of the second curved portion 321. That is, at least one end of the second curved portion 321 is provided with a second protrusion 322. In this way, a stress on the second corner guard 32 may be released through the second protrusion(s) 322, thereby preventing the corner 41 from being overstressed.

For example, the number of the second protrusion(s) 322 is two, and the two second protrusions 322 are disposed on two ends of the second curved portion 321, respectively, and protrude from the outer wall of the second curved portion 321 in two directions that are perpendicular to each other, respectively.

For example, the two second protrusions 322 are of a same shape and of a same size. In this way, the two ends of the second curved portion 321 may be more uniformly stressed.

In addition, the two second protrusions 322 may further be axisymmetric, so as to maintain a stress balance.

For example, as shown in FIG. 4, a height h2 of the second protrusion 322 is not less than one third of a width d2 of the second curved portion 321, and is not greater than a half of the width d2 of the second curved portion 321. As shown in FIG. 4, the height 112 of the second protrusion 322 is a length of the second protrusion 322 in a direction facing away from an inner wall of the second curved portion 321.

The width d2 of the second curved portion 321 is a minimum distance between the inner wall and the outer wall of the second curved portion 321.

As shown in FIG. 2, solid arrows in FIG. 2 show stresses on the first corner guard 31 and the second corner guard 32, and outlined arrows show directions in which the first corner guard 31 and the second corner guard 32 release the stresses.

A material of the reinforcing layer 3 may be a photoresist such as an ultraviolet curing resin adhesive, which may be formed on the display substrate 1 through a photoetching process. For example, both the first corner guard 31 and the second corner guard 32 are made of the photoresist material, and the first curved portion 311 and the first protrusion(s) 312 of a same first corner guard 31 are of an integral structure, and the second curved portion 321 and the second protrusion(s) 322 of a same second corner guard 32 are of an integral structure. When the reinforcing layer 3 is formed, the first corner guards 31 and the second corner guards 32 may be formed through a single patterning process.

Figure 5:
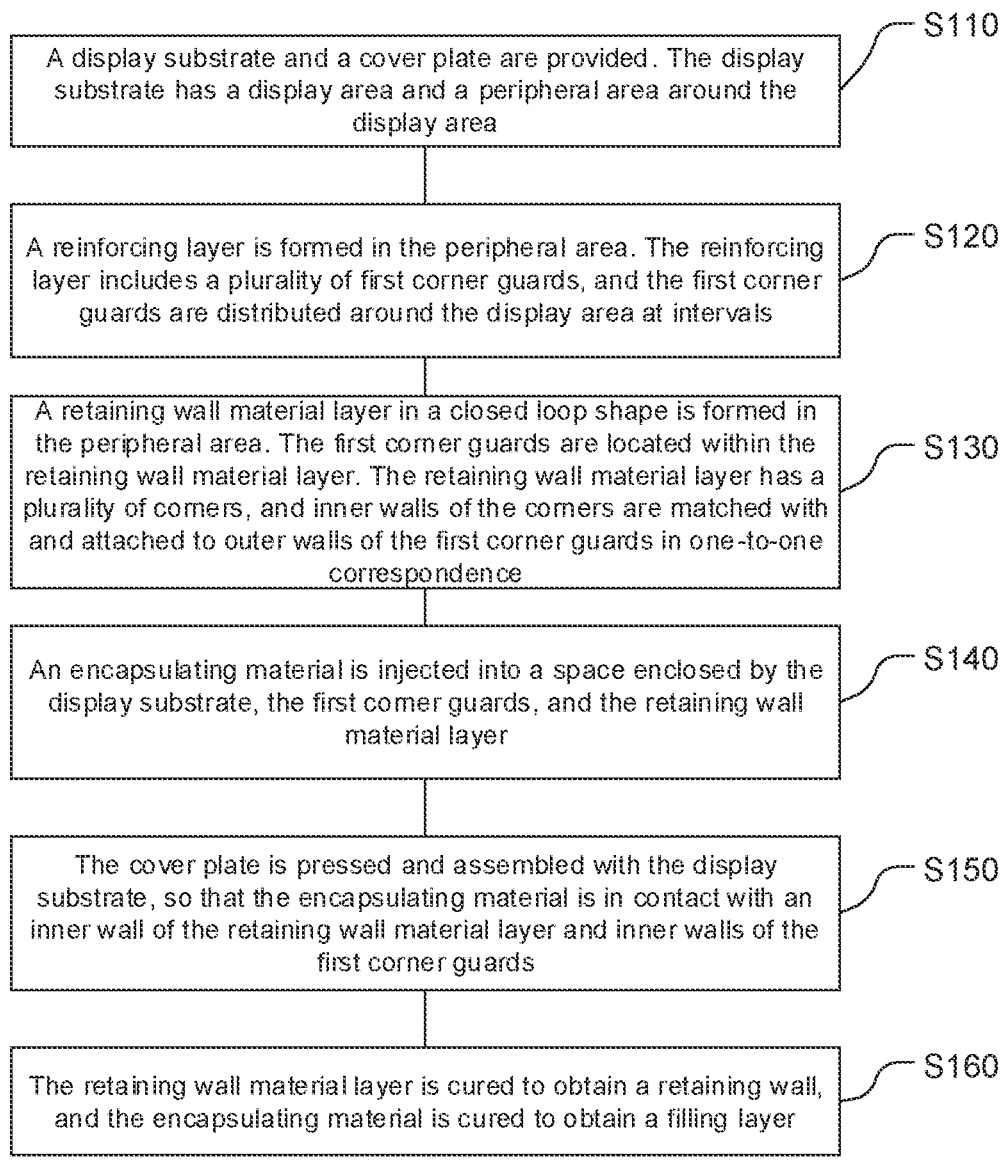
FIG. 5 is a flow diagram of a manufacturing method of a display panel, in accordance with some embodiments.

Some embodiments of the present disclosure provide a manufacturing method of a display panel. The display panel may be the display panel 100 described above, and specific structure thereof will not be repeated herein. As shown in FIG. 5, the manufacturing method may include S110 to S150.

In S110, a display substrate and a cover plate are provided. The display substrate has a display area and a peripheral area around the display area.

In S120, a reinforcing layer is formed in the peripheral area. The reinforcing layer includes a plurality of first corner guards, and the first corner guards are distributed around the display area at intervals.

In S130, a dam material layer in a closed loop shape is formed in the peripheral area. The first corner guards are located within the dam material layer. The dam material layer has a plurality of corners, and inner walls of the corners are matched with and in contact with outer walls of the first corner guards in one-to-one correspondence.

In S140, an encapsulating material is injected into a space enclosed by the display substrate, the first corner guards, and the dam material layer.

In S150, the cover plate is pressed and assembled with the display substrate, so that the encapsulating material is in contact with an inner wall of the dam material layer and inner walls of the first corner guards.

In S160, the dam material layer is cured to obtain a dam, and the encapsulating material is cured to obtain a filling layer.

Beneficial effects of the manufacturing method in the embodiments of the present disclosure may be referred to the beneficial effects of the display panel, which will not be repeated herein.

Various steps of the manufacturing method are described below.

In S110, structures of the display substrate 1 and the cover plate 2 have been described in the embodiments of the display panel, which will not be described in detail herein.

Figure 3:
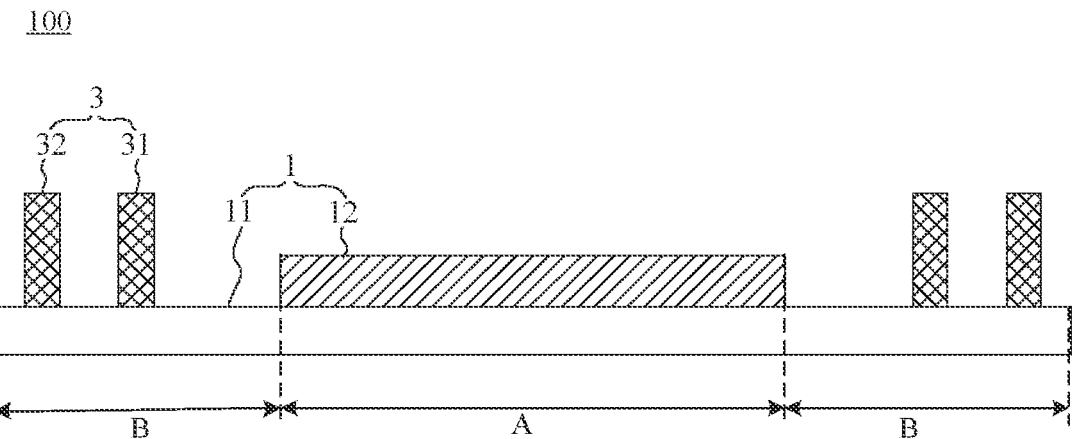
FIG. 3 is a sectional view of a display panel in which no cover plate and dam are provided, in accordance with some embodiments.

In S120, as shown in FIGS. 3 and 4, the reinforcing layer 3 may be formed on the display substrate 1 according to a pre-determined position of the reinforcing layer 3. A specific structure of the reinforcing layer 3 has been described in the embodiments of the display panel, which will not be described in detail herein. The reinforcing layer 3 may be made of a same material, and thus may be formed through a single patterning process. For example, materials of the first corner guard 31 and the second corner guard 32 are a same photoresist, and therefore, forming the reinforcing layer 3 in the peripheral area B, i.e., S120, includes:

forming the first corner guards and the second corner guards through a single patterning process.

It will be noted that, when the reinforcing layer 3 is formed, a space required by the dam material layer 4 may be reserved. For example, a channel between the first corner guard 31 and the second corner guard 32 that correspond to a same corner 41 is reserved for allowing the dam material layer 4 to pass through.

In S130, as shown in FIGS. 1 and 2, a process of forming the dam material layer depends on a material thereof. For example, if the material of the dam material layer is a photoresist, a photoresist layer may be coated on the display substrate 1, and then the dam material layer is obtained through an exposure and a development.

In S140, as shown in FIGS. 1 and 2, the encapsulating material may be coated in a region surrounded by the dam material layer on the display substrate 1. An amount of the encapsulating material is limited to that a space enclosed by the encapsulating material is able to be filled up.

In S150, as shown in FIG. 1, when the cover plate 2 is pressed and assembled with the display substrate 1, the encapsulating material may be pressed, so that the encapsulating material is matched with and in contact with the inner wall of the dam material layer and surfaces of the first corner guards 31 facing away from the dam material layer.

In S160, as shown in FIG. 1, the curing of the dam material layer and the curing of the encapsulating material depend on their materials. For example, through light or heating, the dam material layer is cured to be the dam 4, and the encapsulating material is cured to be the filling layer 5. Specific structures of the dam and the filling layer 5 have been described in the embodiments of the display panel, which will not be described in detail herein.

It will be noted that, although the various steps of the method are described in a specific order in the accompanying drawings, this does not require or imply that these steps must be performed according to the specific order, or that all of the steps as shown must be performed to achieve a desired result. Additionally or optionally, some steps may be omitted, multiple steps may be combined into one step for execution, and/or one step may be resolved into multiple steps for execution.

Embodiments of the present disclosure further provide a display device that includes the display panel described above, A structure of the display panel may be referred to the structure in the embodiments of the display panel described above, which will not be repeated herein. Since the display panel in the above embodiments is adopted in the display device, the display panel and the display device have the same beneficial effects. The display device may be used in a terminal device such as a mobile phone, a tablet computer, an electronic watch, which will not be enumerated one by one herein.

The forgoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel, comprising:
a display substrate having a display area and a peripheral area around the display area;
a cover plate assembled with the display substrate;
a reinforcing layer disposed in the peripheral area and located between the display substrate and the cover plate, the reinforcing layer including a plurality of first corner guards, and the first corner guards being distributed around the display area at intervals;
a dam disposed in the peripheral area and located between the display substrate and the cover plate, the dam being of a closed loop structure around the display area, and the dam having a plurality of corners, and inner walls of the corners being matched with and in contact with outer walls of the first corner guards in one-to-one correspondence; and
a filling layer filled in a space enclosed by the display substrate, the cover plate, the first corner guards and the dam, the filling layer being in contact with inner walls of the first corner guards,
wherein the reinforcing layer further includes: a plurality of second corner guards, the second corner guards being distributed around the dam at intervals, and being arranged on outer sides of the corners in one-to-one correspondence.

2. The display panel according to claim 1, wherein a corner in the corners is in an arc shape, and a first corner guard in contact with the corner includes:
a first curved portion, radians of the first curved portion being same as radians of the corner.

3. The display panel according to claim 2, wherein the first corner guard further includes:
at least one first protrusion disposed on an inner wall of the first curved portion.

4. The display panel according to claim 3, wherein a height of a first protrusion in the at least one first protrusion is not less than one third of a width of the first curved portion, and is not greater than a half of the width of the first curved portion; the width of the first curved portion is a minimum distance between the inner wall and an outer wall of the first curved portion.

5. The display panel according to claim 3, wherein the at least one first protrusion includes two first protrusions, and the two first protrusions are disposed on two ends of the first curved portion, respectively.

6. The display panel according to claim 5, wherein the two first protrusions are of a same shape and of a same size.

7. The display panel according to claim 5, wherein the two first protrusions are axisymmetric.

8. The display panel according to claim 1, wherein a corner in the corners is in an arc shape, and a second corner guard in contact with the corner includes:
a second curved portion, radians of the second curved portion being not less than radians of the corner.

9. The display panel according to claim 8, wherein the second corner guard further includes:
at least one second protrusion disposed on an outer wall of the second curved portion.

10. The display panel according to claim 9, wherein a height of a second protrusion in the at least one second protrusion is not less than one third of a width of the second curved portion, and is not greater than a half of the width of the second curved portion;
the width of the second curved portion is a minimum distance between an inner wall and the outer wall of the second curved portion.

11. The display panel according to claim 9, wherein the at least one second protrusion includes two second protrusions, and the two second protrusions are disposed on two ends of the second curved portion, respectively.

12. The display panel according to claim 11, wherein the two second protrusions are of a same shape and of a same size.

13. The display panel according to claim 11, wherein the two second protrusions are axisymmetric.

14. The display panel according to claim 1, wherein each second corner guard and a corresponding corner have a gap therebetween.

15. The display panel according to claim 1, wherein the reinforcing layer is made of a photoresist.

16. A display device, comprising the display panel according to claim 1.

17. A manufacturing method of a display panel, comprising:
  providing a display substrate and a cover plate, the display substrate having a display area and a peripheral area around the display area;
  forming a reinforcing layer in the peripheral area, the reinforcing layer including a plurality of first corner guards distributed around the display area at intervals;
  forming a dam material layer in a closed loop shape in the peripheral area, the first corner guards being located in a region enclosed by the dam material layer, the dam material layer having a plurality of corners, and inner walls of the corners being matched with and in contact with outer walls of the first corner guards in one-to-one correspondence;
  injecting an encapsulating material into a space enclosed by the display substrate, the first corner guards and the dam material layer;
  pressing the cover plate and assembling the cover plate with the display substrate, so that the encapsulating material is in contact with an inner wall of the dam material layer and inner walls of the first corner guards;
  curing the dam material layer to obtain a dam; and
  curing the encapsulating material to obtain a filling layer,
  wherein forming the reinforcing layer further includes:
    forming a plurality of second corner guards, the second corner guards being distributed around the dam material layer at intervals, and being arranged on outer sides of the corners in one-to-one correspondence.

18. The manufacturing method according to claim 17, wherein forming the reinforcing layer in the peripheral area, includes:
  forming the first corner guards and the second corner guards through a single patterning process.

* * * * *

UNITED STATES PATENT AND TRADEMARK OFFICE
CERTIFICATE OF CORRECTION

PATENT NO. : 11,991,895 B2
APPLICATION NO. : 17/286835
DATED : May 21, 2024
INVENTOR(S) : Chengyuan Luo It is certified that error appears in the above-identified patent and that said Letters Patent is hereby corrected as shown below:

On the Title Page

Item [86], "PCT/CN20201100745" should be "PCT/CN2020/100745".

Signed and Sealed this
Twentieth Day of August, 2024

Katherine Kelly Vidal
*Director of the United States Patent and Trademark Office*